(12) United States Patent
Nayak et al.

(10) Patent No.: US 6,567,970 B1
(45) Date of Patent: May 20, 2003

(54) PLD CONFIGURATION ARCHITECTURE

(75) Inventors: Anup Nayak, Fremont, CA (US);
Navaz Lulla, Fremont, CA (US);
Ramin Ighani, Santa Clara, CA (US);
Rajiv Nema, Fremont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 160 days.

(21) Appl. No.: 09/751,234

(22) Filed: Dec. 27, 2000

(51) Int. Cl.$^7$ ............................................... G06F 17/50
(52) U.S. Cl. ............................... 716/17; 716/17; 716/16
(58) Field of Search .............................. 716/16, 17, 18, 716/20, 19; 395/500; 326/40, 41, 42

(56) References Cited

U.S. PATENT DOCUMENTS

| | | | | |
|---|---|---|---|---|
| 4,717,914 A | | 1/1988 | Scott ..................... | 340/825.06 |
| 5,745,734 A | * | 4/1998 | Craft et al. ..................... | 326/39 |
| 5,881,254 A | * | 3/1999 | Corrigan et al. ............ | 710/306 |
| 6,216,259 B1 | * | 4/2001 | Guccione et al. ............. | 716/17 |
| 6,219,824 B1 | * | 4/2001 | Borland ........................ | 326/38 |
| 6,259,271 B1 | * | 7/2001 | Couts-Martin et al. ....... | 326/40 |
| 6,304,101 B1 | * | 10/2001 | Nishihara ..................... | 326/40 |
| 6,363,519 B1 | * | 3/2002 | Levi et al. ................... | 709/203 |
| 6,421,817 B1 | * | 7/2002 | Mohan et al. ................. | 716/16 |

* cited by examiner

*Primary Examiner*—Vuthe Siek
*Assistant Examiner*—Binh Tat
(74) *Attorney, Agent, or Firm*—Christopher P. Maiorana, P.C.; Robert M. Miller

(57) ABSTRACT

An apparatus comprising one or more configuration blocks. The configuration blocks (i) may comprise a number of configuration elements and (ii) may be configured to initiate reading or writing of the configuration elements in response to a control input.

21 Claims, 4 Drawing Sheets

PLD CONFIGURATION ARCHITECTURE

FIELD OF THE INVENTION

The present invention relates to a method and/or architecture for configuring programmable logic devices generally and, more particularly, to a method and/or architecture for programming configuration bits of programmable logic devices.

BACKGROUND OF THE INVENTION

A programmable logic device (PLD) provides an economical and efficient means for implementing predetermined Boolean logic functions in an integrated circuit. Such a device consists of, generally, an AND plane configured to generate predetermined product terms in response to a plurality of inputs, a group of fixed/programmable OR gates configured to generate a plurality of sum-of-product(SOP) terms in response to the product terms, and a number of logic elements (i.e., macrocells) configured to generate a desired output in response to the sum-of-products terms. The sum-of-products terms can also be generated using programmable NOR-NOR logic.

The arrangement and operation of components within the PLD are programmed by architecture configuration bits. The architecture configuration bits are set prior to normal operation of a PLD. The configuration bits can be stored in volatile memory (i.e., SRAM) or non-volatile memory (i.e., EEPROM/flash). The bits are set using an operation called "programming" or "configuration".

Conventional configuration memories organize the configuration bits in a single rectangular array. The array is programmed by loading appropriate values into a set of row and column address registers. Either a single central controller or an external programmer controls the configuration operations. The controller or external programmer must also keep track of all configuration bit counts.

The number of configuration bits can vary from one device to another, even within the same device family. Different numbers of configuration bits require different array geometries. Because the external programmer/controller must keep track of bit counts, programming different devices, even of the same family, requires complicated programming in the external controller/programmer.

A configuration memory and control architecture that is easy to scale and program for different devices would be desirable.

SUMMARY OF THE INVENTION

The present invention concerns an apparatus comprising one or more configuration blocks. The configuration blocks (i) may comprise a number of configuration elements and. (ii) may be configured to initiate reading or writing of the configuration elements in response to a control input.

The objects, features and advantages of the present invention include providing a method and/or architecture for programming configuration bits of programmable logic devices that may (i) provide full chip configuration, (ii) provide a fully scalable configuration architecture, (iii) speed up programming times, (iv) organize configuration elements in relatively small autonomous configuration blocks, (v) use global input lines, (vi) use PLD type blocks and/or embedded RAM blocks as configuration blocks, (iv) simplify programming, and/or (v) provide a programming scheme that may be independent of device type and family.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
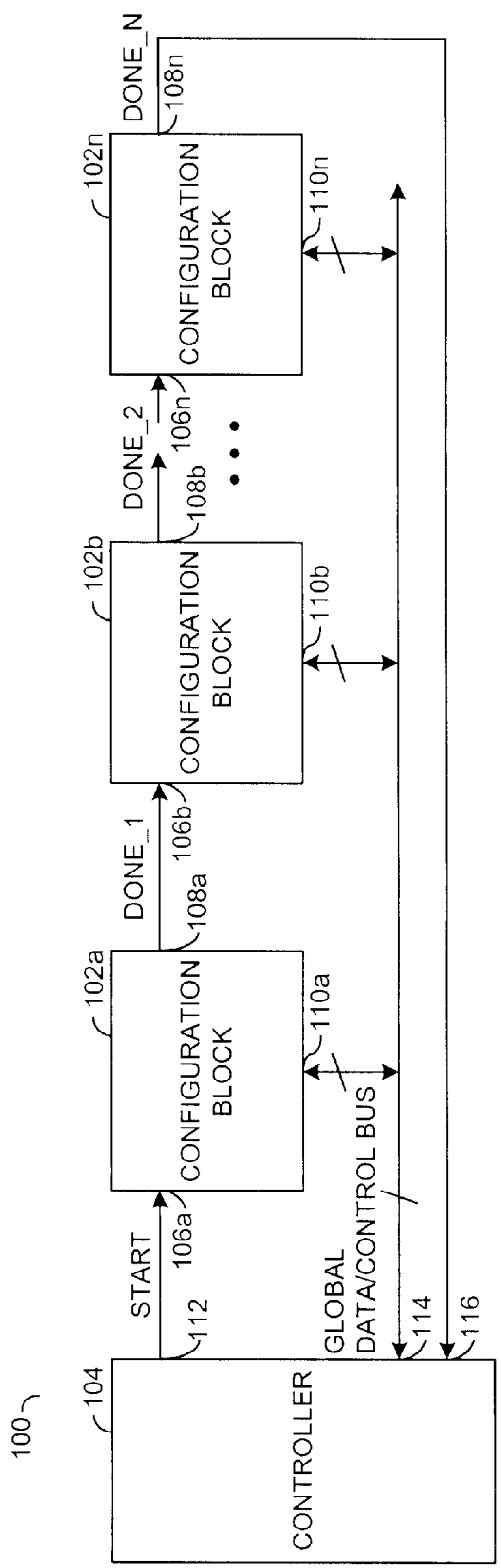
FIG. 1 is a block diagram of a preferred embodiment of the present invention.

Referring to FIG. 1, a block diagram of a circuit 100 is shown in accordance with a preferred embodiment of the present invention. The circuit 100 may be implemented as a configuration portion of a programmable logic device (PLD). The circuit 100 may comprise a number of circuits 102a–102n and a circuit 104. The circuits 102a–102n may be implemented, in one example, as configuration blocks. The circuit 104 may be implemented, in one example, as a global configuration controller circuit. Each of the circuits 102a–102n may comprise a number of configuration elements. The configuration elements may be used to store configuration bits. The circuits 102a–102n may have an input 106a–106n that may receive a signal (e.g., START), an output 108a–108n that may present a signal (e.g., DONE_1–DONE_N), and an input/output 110a–110n that may present and receive a number of signals (e.g., GCFGCLK, GRWB, GPALCFGB, GTESTCFG, GBLKSEL, GCFGDIN, and GCFGDOUT).

The signal START may be, in one example, a control signal used to initiate configuration of the circuits 102a–102n. The IV signals DONE_1–DONE_N may be, in one example, control signals used to generally indicate that configuration of the circuits 102a–102n, respectively, may be completed. The signals DONE_1–DONE_(N–1) may be used in place of the signal START to initiate configuration of the circuits 102b–102n. The signals GCFGCLK, GRWB, GPALCFGB, GTESTCFG, GBLKSEL, GCFGDIN, and GCFGDOUT may be, in one example, global clock, global data and/or global control signals.

The circuit 104 may have an output 112 that may present the signal START, an input/output 114 that may present/receive the signals GCFGCLK, GRWB, GPALCFGB, GTESTCFG, GBLKSEL, GCFGDIN, and GCFGDOUT and an input 116 that may receive the signal DONE_N.

The circuits 102a–102n may be implemented, in one example, as small autonomous configuration blocks that organize and manage a number of configuration elements. Each of the circuits 102a–102n may be configured to read data from or write data to all of the configuration elements in response to one or more of the global signals GCFGCLK, GRWB, GPALCFGB, GTESTCFG, GBLKSEL, GCFGDIN, and GCFGDOUT. Each of the circuits 102a–102n may be implemented, in one example, as either a regular PLD type configuration block or an embedded RAM block. The circuits 102a–102n may be implemented as heterogeneous blocks (e.g., a combination of block types and/or number of configuration elements). The circuits 102a–102n may be initialized at configuration.

The circuit 104 may be configured to initiate configuration of the blocks 102a–102n. The circuit 104 may be configured to initiate configuration in response to a global event such as a power-on-reset, a reconfigure command or a JTAG configuration instruction in accordance with the IEEE 1149.1-1990 standard (JTAG), published in 1990, which is hereby incorporated by reference in its entirety. The circuit 104 may be configured to generate a global reset signal that travels around the chip and returns back to the circuit 104. When the circuit 104 recognizes the return of the reset signal, the circuit 104 may de-assert the reset signal. Other global control signals may be implemented similarly. For example, programmable logic device (PLD) control logic may be implemented such that correct operation is ensured by detecting the action of the control signals rather than just generating the control signals. Only after all the global signals (e.g., GRESETB, GPALCFGB, etc.) are detected to be asserted correctly, a start configure signal may be presented to the first configuration block 102a.

The circuit 104 may initiate configuration of the blocks 102a–102n by presenting the signal START to a first block (e.g., 102a). Each of the circuits 102a–102n may be configured to autonomously configure the configuration elements contained within the respective circuit. A configuration block (e.g., 102j) may begin configuration of the respective configuration elements in response to a previous configuration block (e.g., 102i) presenting the signal DONE_i. The programming operation of the configuration blocks 102a–102n may propagate from block to block in response to the signals DONE_1–DONE_N. The signal DONE_N from the last block 104n may be used to indicate that all of the configuration blocks 102a–102n have been read or programmed.

Figure 2:
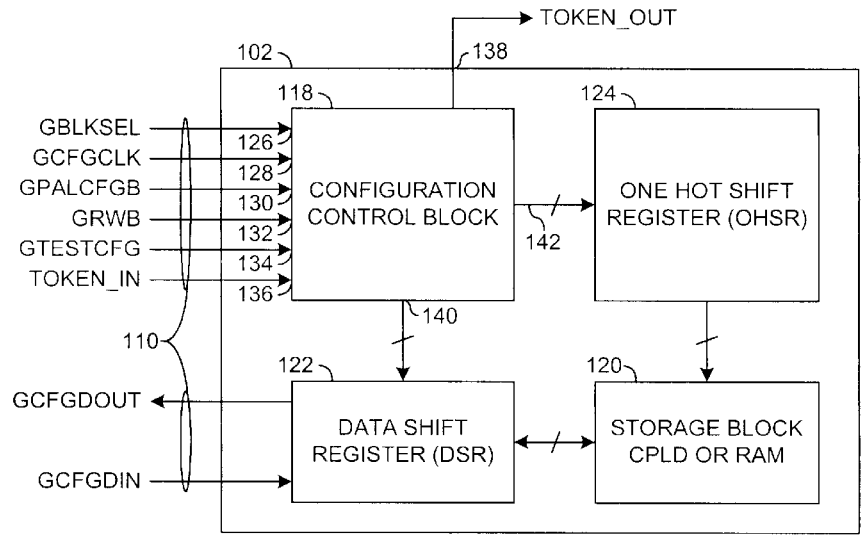
FIG. 2 is a detailed block diagram illustrating a configuration block of FIG. 1.

Referring to FIG. 2, a block diagram illustrating a circuit 102 of FIG. 1 is shown. The circuit 102 may comprise a circuit 118, a circuit 120, a shift register 122 and a shift register 124. The circuit 118 may be implemented, in one example, as a configuration control circuit or block. The circuit 120 may be implemented as a storage circuit or block. The circuit 120 may be implemented, for example, as a complex programmable logic device (CPLD) configuration block or an embedded random access memory (RAM). The circuit 122 may be implemented as a data shift register (DSR). The circuit 124 may be implemented as a one-hot shift register (OHSR).

The circuit 118 may have an input 126 that may receive the signal GBLKSEL, an input 128 that may receive the signal GCFGCLK, an input 130 that may receive the signal GPALCFGB, an input 132 that may receive the signal GRWB, an input 134 that may receive the signal GTESTCFG, an input 136 that may receive a signal (e.g., TOKEN_IN), an output 138 that may present a signal (e.g., TOKEN_OUT), an output 140 that may present one or more control signals to the shift register 122, and an output 142 that may present one or more control signals to the shift register 124.

The circuit 122 may have an input that may receive the signal GCFGDIN and an output that may present the signal GCFGDOUT. The circuit 122 may be coupled to the circuit 120 via a bidirectional bus. The circuit 124 may have an output that may present, for example, column signals to the circuit 120. The signal START may be presented to the circuit 102 as the signal TOKEN_IN. The signal TOKEN_OUT may be presented by the circuit 102 as the signal DONE.

In general, the control signals (e.g., GCFGCLK, GRWB, GPALCFGB, GTESTCFG, GBLKSEL, etc.) determine whether the block 102 is in a configuration mode. When the block 102 is in the configuration mode, the control signals may determine whether the block 102 is programmed or verified. In the programming mode, data presented in the signal GCFGDIN may be stored in the storage block 120. In the verification mode, data which is stored in the block 120 may be presented as the signal GCFGDOUT one or more configuration blocks 102 may be programmed simultaneously. However, only one configuration block 102 may be verified at a given instant. In general, the signal TOKEN_IN determines whether a configuration block is selected for configuration. Other control signals may be used to determine whether the block is in a programming or verifying mode.

Data may be presented to the data shift register 122 via the signal GCFGDIN. The circuit 118 may be configured to count data shifted into and out of the DSR 122. When the DSR 122 is full (empty), the configuration control block 118 may be configured to control a write(read) operation of the storage block 120. When the writing or reading of a column in the storage block 120 is completed, the configuration control block 118 moves the OHSR 124 to the next column of the circuit 120. The process may continue until the entire block 120 is either programmed or verified. When the storage block 120 is being verified, data read from the storage block 120 may be shifted out of the DSR 122 as the signal GCFGDOUT.

Figure 3:
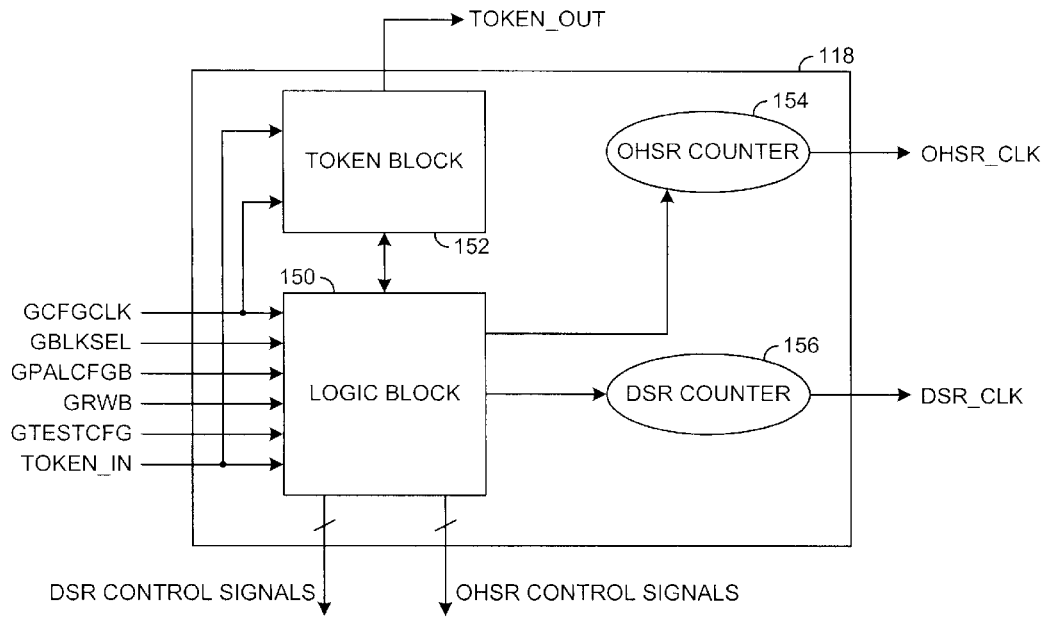
FIG. 3 is detailed block diagram illustrating a control block of FIG. 2.

Referring to FIG. 3, a detailed block diagram illustrating the control block 118 of FIG. 2 is shown. The circuit 118 may comprise a circuit 150, a circuit 152, a counter 154 and a counter 156. The circuit 150 may be implemented as a logic block. The circuit 152 may be implemented as a token block. The counter 154 may be implemented as a shift counter for the OHSR 124. The counter 156 may be implemented as a shift counter for the DSR 122. The signals TOKEN_IN and GCFGCLK may be presented to inputs of the circuits 150 and 152. The signals GTESTCFG, GRWB, GPALCFGB, and GBLKSEL may be presented to the circuit 150. The circuit 150 may be configured to present/receive signals to/from the circuit 152. The circuit 150 may present control signals to the data shift register DSR and the one hot shift register. The circuit 150 may control the OHSR counter 154 and the DSR counter 156. The token block 152 may present the signal TOKEN_OUT. The OHSR counter 154 may have an output that may present a clock signal (e.g., OHSR_CLK). The DSR counter 156 may have an output that may present a signal (e.g., DSR_CLK).

Figure 4:
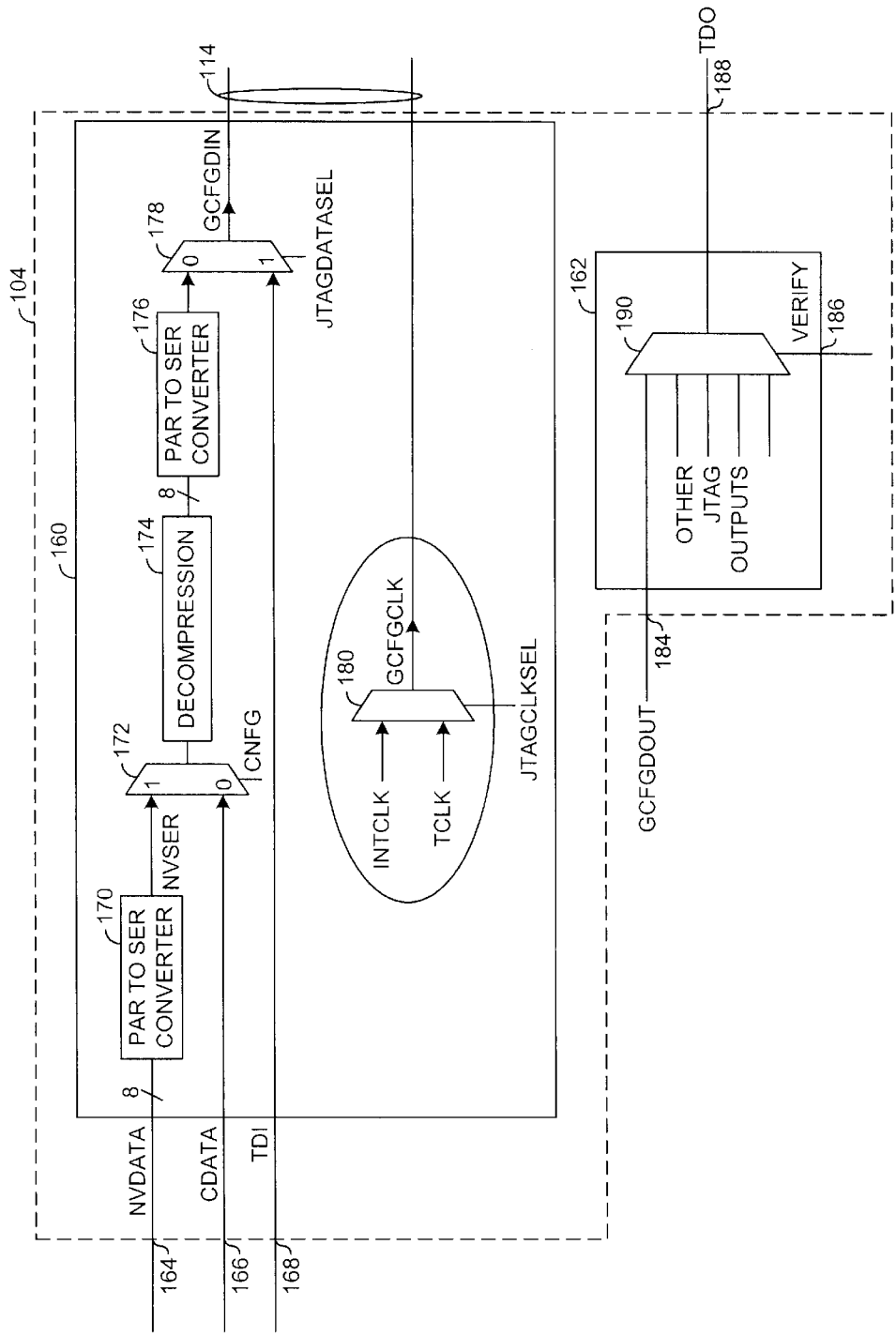
FIG. 4 is a detailed block diagram illustrating an implementation of a controller circuit of FIG. 1.

Referring to FIG. 4, a more detailed block diagram of the circuit 104 of FIG. 1 is shown. The circuit 104 may comprise a circuit 160 and a circuit 162. The circuit 160 may be implemented as an input circuit. The circuit 162 may be implemented as an output circuit. The circuit 162 may have an input 164 that may receive a signal (e.g., NVDATA), an input 166 that may receive a signal (e.g., CDATA), an input 168 that may receive a signal (e.g., TDI), an input that may receive a control signal (e.g., JTAGCLKSEL), an input that may receive a control signal (e.g., CNFG), an input that may receive a control signal (e.g., JTAGDATASEL), an input that may receive a clock signal (e.g., INTCLK), an input that may receive a clock signal (e.g., TCLK), an output that may present the signal GCFGCLK, and an output that may present the signal GCFGDIN. The signal NVDATA may be an N-bits wide parallel data signal, where N is an integer. In one example, N may be equal to 8. The signal CDATA may be a serial data signal. The signal INTCLK may be an internally generated clock signal. The circuit 160 may be configured to generate the signal GCFGDIN in response to the signals NVDATA, CDATA, TDI, CNFG, and JTAG-DATASEL. The circuit 160 may be configured to select either the signal INTCLK or the signal TCLK as the signal GCFGCLK in response to the signal JTAGCLKSEL.

The circuit 160 may comprise a parallel to serial converter circuit 170, a multiplexer 172, a decompression circuit 174, a parallel to serial converter circuit 176, a multiplexer 178 and a multiplexer 180. The signal NVDATA may be presented to an input of the parallel to serial converter circuit 170. The parallel to serial converter circuit 170 may have an output that may present a signal (e.g., NV_SER) to a first input of the multiplexer 172. The signal CDATA may be presented to a second input of the multiplexer 172. The signal CNFG may be presented to a control input of the multiplexer 172.

When the signal CNFG is in a first state (e.g., a logical 1, or HIGH), the multiplexer 172 may present the signal NV_SER to an input of the decompression circuit 174. When the signal CNFG is in a second state, (e.g., a logical 0, or LOW), the multiplexer may present the signal CDATA to the input of the decompression circuit 174. The decompression circuit 174 may have an output that may present a signal to an input of the parallel to serial converter circuit 176. The signal from the decompression circuit may be N-bits wide, where N is an integer. In one example, N may be equal to 8.

The parallel to serial converter circuit 176 may have an output that may present a signal to a first input of the multiplexer 178. The multiplexer 178 may have a second input-that may receive the signal TDI and a control input that may receive the signal JTAGDATASEL. When the signal JTAGDATASEL is in a first state (e.g., a logical 0, or LOW), the multiplexer 178 may select the signal from the parallel to serial converter circuit 176 as the signal GCFG-DIN. When the signal JTAGDATASEL is in a second state (e.g., a logical 1, or HIGH), the multiplexer 178 may select the signal TDI as the signal GCFGDIN.

The signal INTCLK may be presented to a first input of the multiplexer 180. The signal TCLK may be presented to a second input of the multiplexer 180. The multiplexer 180 may be configured to select the signal. INTCLK or the signal TCLK as the signal GCFGCLK.

The circuit 162 may have an input 184 that may receive the signal GCFGDOUT, an input 186 that may receive the signal VERIFY and an output 188 that may present the signal TDO. The circuit 162 may be configured to generate the signal TDO in response to the signal GCFGDOUT, the signal VERIFY, and any other JTAG outputs that may be implemented.

The circuit 162 may comprise a multiplexer 190. The multiplexer 190 may have a first input that may receive the signal GCFGDOUT, a number of other inputs that may receive various JTAG outputs, and a control input that may receive the signal VERIFY. When the signal VERIFY is in a first state, the multiplexer 190 may select the signal GCFGDOUT as the signal TDO.

Configuration data may come from a number of sources. For example, configuration data may come from a serial or a parallel non-volatile memory device. During a power on reset, the signal CNFG may select whether data is received from the serial or the parallel memory device. Configuration may also be initiated via a JTAG interface. When configuration is initiated via the JTAG interface, configuration data may be received via the signal TDI. When configuration is from the serial or parallel memory devices, the clock used for configuration (GCFGCLK) may be generated internally by the circuit 100. When the configuration is performed using the JTAG interface, the configuration clock may be generated using the JTAG clock TCLK.

Configuration information of the device may be verified using the JTAG interface. When the JTAG interface is used to verify configuration, the configuration information may be shifted out of the device as the signal TDO. The signals TDI, TDO, TCLK, VERIFY, JTAGCLKSEL, and JTAG-DATASEL may be implemented in accordance with the IEEE 1149.1-1990 standard (JTAG).

Figure 5:
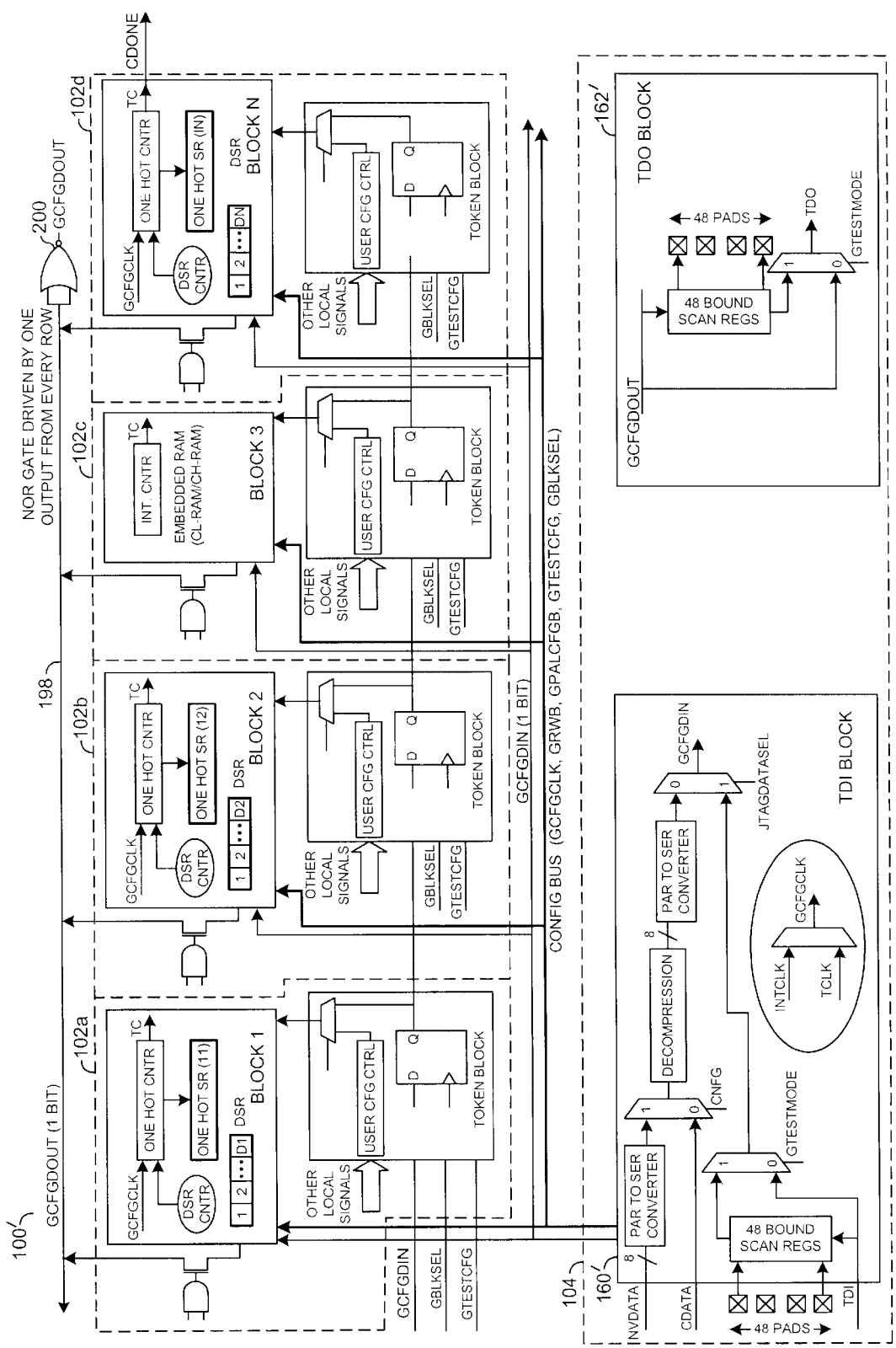
FIG. 5 is a detailed diagram illustrating an implementation with heterogeneous configuration blocks in accordance with the present invention.

Referring to FIG. 5, a block diagram illustrating a circuit 100' implemented in accordance with the present invention is shown. The circuit 100' may comprise, in one example, four configuration blocks 102a–102a. The configuration blocks 102a 102b and 102d may be implemented as PLD type configuration blocks. The configuration block 102c may be implemented as an embedded RAM block. Each of the configuration blocks 102a–102d may present the signal GCFGDOUT via a gate to a shared bus 198. A number of shared busses 198 may be combined, in one example, by a gate 200. While four configuration blocks are shown, any number of blocks may be implemented to meet the design criteria of a particular application.

The configuration blocks 102a–102d may be connected in series, in one example, by connecting an output of the token block of one configuration block to an input of the token block of a next configuration block. The signal GCFGDIN may be presented to an input of the logic block and token block of the configuration block 102a. A signal (e.g., CDONE) may be presented at an output of the configuration block 102d.

The configuration block 102a may begin configuring configuration elements in response to the signal GCFGDIN. The configuration elements may be configured in response to one or more of the signals GCFGCLK, GRWB, GPALCFGB, GTESTCFG, and GBLKSET. When the configuration of the configuration elements of configuration block 102a is completed, the configuration block 102a may initiate the configuration block 102b to begin configuring configuration elements in a similar manner. Each of the configuration blocks 102b–102d may be configured to autonomously configure configuration elements of the particular configuration block when the configuration elements of a previous configuration block have been configured. The signal CDONE may be presented following configuration of the configuration elements of the configuration block 102a. The signal CDONE may indicate that the configuration elements of the configuration block 102a–102d have been configured. Verification of the configuration elements of the configuration blocks 102a–102d may be similarly performed.

The various signals are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

The present invention may provide a PLD configuration architecture that uses a combination of (i) inter-block handshaking signals and (ii) synchronous global input and control signals to provide for full chip configuration. The architecture may comprise an arbitrary number of heterogeneous configuration blocks to meet the design criteria of a particular application. The present invention may provide an easily scalable configuration architecture that speeds up and simplifies programming of configuration elements of programmable logic devices. The present invention may, in one example, eliminate the requirement of shifting addresses to program configuration elements.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:

a global bus;

one or more configuration blocks each (i) comprising a number of configuration elements and (ii) configured to initiate reading or writing of said configuration elements in response to a control input, wherein data received from said global bus is written to said configuration elements in a first mode and data read from said configuration elements is presented to said global bus in a second mode; and a control circuit configured to (i) generate said control input and (ii) present said data to and receive said data from said global bus.

2. The apparatus according to claim 1, wherein said reading and writing transfers said data between said one or more configuration blocks and said global bus in response to one or more global control signals.

3. The apparatus according to claim 1, wherein each of said configuration blocks is further configured to generate a status output.

4. The apparatus according to claim 3, wherein said status output of each of said configuration blocks is presented as said control input of a next configuration block.

5. The apparatus according to claim 3, wherein said control input and said status output comprise handshaking signals.

6. The apparatus according to claim 1, wherein said reading and writing of said configuration elements are synchronous operations.

7. The apparatus according to claim 2, wherein:

said control circuit is further configured to (i) present said control input to a first one of said one or more configuration blocks, (ii) generate said global control signals, and (iii) receive said status output presented by a last one of said one or-more configuration blocks.

8. The apparatus according to claim 7, wherein the same configuration block receives said control input and presents said status output.

9. The apparatus according to claim 1, wherein said configuration blocks are heterogeneous.

10. The apparatus according to claim 9, wherein one or more of said configurations blocks comprise a PLD type block.

11. The apparatus according to claim 9, wherein one or more of said configurations blocks comprise an embedded memory block.

12. The apparatus according to claim 11, wherein said embedded memory block comprises random access memory.

13. The apparatus according to claim 9, wherein said configuration blocks comprise the same or different numbers of configuration elements.

14. The apparatus according to claim 1, wherein said apparatus comprises a programmable logic device.

15. The apparatus according to claim 1, wherein one or more of said configuration blocks comprise a one-hot shift register configured to control said reading and writing of said configuration elements.

16. The apparatus according to claim 1, wherein one or more of said configuration blocks comprise a shift register configured to transfer data between said configuration elements and said global bus.

17. The apparatus according to claim 1, wherein said apparatus is part of an integrated circuit.

18. A method for configuring a programmable logic device, comprising the steps of:

(A) initiating configuration or verification of one or more configuration blocks in response to a first control signal;

(B) programming a number of configuration elements of said one or more configuration blocks with data received from a global bus in a first mode and reading data from said number of configuration elements and presenting said read data to said global bus for verification in a second mode; and (C) generating a second control signal when said configuration or verification of said one or more configuration blocks is complete.

19. The method according to claim 18, further comprising the step of:

(D) repeating steps A–C on a next configuration block.

20. The method according to claim 19, further comprising the step of:

(E) terminating configuration or verification of said programmable logic device when step C is completed on a last configuration block.

21. A programmable logic device comprising:

means for configuring said programmable logic device arranged as one or more configuration blocks, wherein data received from a global bus is written -to said configuration blocks in a first mode and data read from said configuration blocks is presented to said global bus in a second mode;

means for initiating said writing or reading of each of said one or more configuration blocks in response to a control input and indicating completion of said reading and writing; and means for generating said control input and (ii) presenting said data to and receiving said data from said global bus.

* * * * *